United States Patent
Volke

(10) Patent No.: US 7,940,503 B2
(45) Date of Patent: May 10, 2011

(54) POWER SEMICONDUCTOR ARRANGEMENT INCLUDING CONDITIONAL ACTIVE CLAMPING

(75) Inventor: Andreas Volke, Soest (DE)

(73) Assignee: Infineon Technologies AG, Neubiberg (DE)

( * ) Notice: Subject to any disclaimer, the term of this patent is extended or adjusted under 35 U.S.C. 154(b) by 273 days.

(21) Appl. No.: 12/127,486

(22) Filed: May 27, 2008

(65) Prior Publication Data

US 2009/0296291 A1      Dec. 3, 2009

(51) Int. Cl.
*H02H 3/20*     (2006.01)
*H02H 9/04*     (2006.01)
*H02H 9/00*     (2006.01)

(52) U.S. Cl. .......................... 361/91.1; 361/56

(58) Field of Classification Search ................... 361/91.1
See application file for complete search history.

(56) References Cited

U.S. PATENT DOCUMENTS 5,561,391 A * 10/1996 Wellnitz et al. ............... 327/309
5,793,232 A *  8/1998 Gallinari et al. .............. 327/110
7,310,006 B2* 12/2007 Shimada ........................ 326/83

OTHER PUBLICATIONS

"2.0 Amp Gate Drive Optocoupler with Integrated (Vce) Desaturation Detection and Fault Status Feedback" Technical Data, HCPL-316J, Agilent Technologies, 1999, pp. 1-32.

* cited by examiner

*Primary Examiner* — Dharti H Patel
(74) *Attorney, Agent, or Firm* — Dicke, Billig & Czaja, PLLC

(57) ABSTRACT

A power semiconductor arrangement including conditional active clamping (CAC). One embodiment includes a power semiconductor arrangement. A controllable power semiconductor switch includes a load path. A driver unit for switching the load path to either an ON-state or an OFF-state. An active clamping (AC) unit configured to switch the load path in the ON-state if the voltage affecting the controllable power semiconductor switch is higher than or equal to an allowable voltage. A switching unit includes a control input, and configured to activate and/or to deactivate the AC unit dependent on a signal applied to the control input.

5 Claims, 5 Drawing Sheets

POWER SEMICONDUCTOR ARRANGEMENT INCLUDING CONDITIONAL ACTIVE CLAMPING

BACKGROUND

The invention relates to power semiconductor circuits, in one embodiment to power semiconductor circuits which are designed for switching inductive loads in self propelled applications.

Power semiconductor circuits are used, inter alia, as switches for supplying electric power to electric loads. For example, such a power semiconductor circuit, e.g., an inverter, may include one or more controllable power semiconductor switches, e.g., IGBTs or MOSFETs. In its ON-state, such a controllable power semiconductor switch may provide electric power to an electrical load.

During the transition phase from the ON- to the OFF-state induced voltages, caused by always existing parasitic stray inductances in the commutation loop, may reach levels dangerous for the controllable power semiconductor. Such voltages, if exceeding the rated break-down voltage of the controllable power semiconductor may lead to the destruction of the device.

One possibility to protect the controllable power semiconductor switch against such damage is active clamping (AC). To reduce an overvoltage affecting the controllable power semiconductor switch, during activated AC the load path of the controllable power semiconductor switch is switched back temporary to its ON-state during the transition of the controllable power semiconductor switch from the ON- to the OFF-state depending on the feedback signal of the AC circuitry.

However, in some applications, conventional AC technology is not applicable: For example, in a Hybrid Electrical Vehicle (HEV) with a permanent synchronous motor (PMSM). Assuming the HEV stays at the top of a hill and rolls then passively down the hill. As the PMSM is connected to the transmission it rotates and charges the DC-link capacitor through the freewheeling diodes of the inverter. If this back electromagnetic force (Back-EMF or BEMF) of the PMSM is higher than the designed activation voltage of the AC circuitry, the AC will be activated and turns on the controllable power semiconductor. Typically this leads to the destruction of the controllable power semiconductor by exceeding the short-circuit safe operating area (SC-SOA). Accordingly, implementation of a standard AC circuitry is not permitted. This scenario is quite unique to self propelling applications like HEV and electric vehicles (EV). Therefore, in standard industrial and consumer applications the need for a modified AC is typically not given.

Hence, there is a need for an improved method for protecting controllable power semiconductor switches particular for self propelled applications.

SUMMARY

A power semiconductor arrangement is provided which includes a controllable power semiconductor switch that includes a load path with a first contact and with a second contact, and a control input for controlling the load path. Further, a driver unit is provided which is designed to switch the load path of the controllable power semiconductor switch in either an ON-state or an OFF-state. The driver unit includes an output which is electrically connected to the control input of the controllable power semiconductor switch. Then, an AC unit is provided which is designed to switch the load path in the ON-state if the voltage affecting the controllable power semiconductor switch is higher than or equal to a pre-defined allowable voltage. Further, a switching unit is provided which includes a control input, and which is designed to activate and/or to deactivate the AC unit dependent on a signal applied to the control input.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
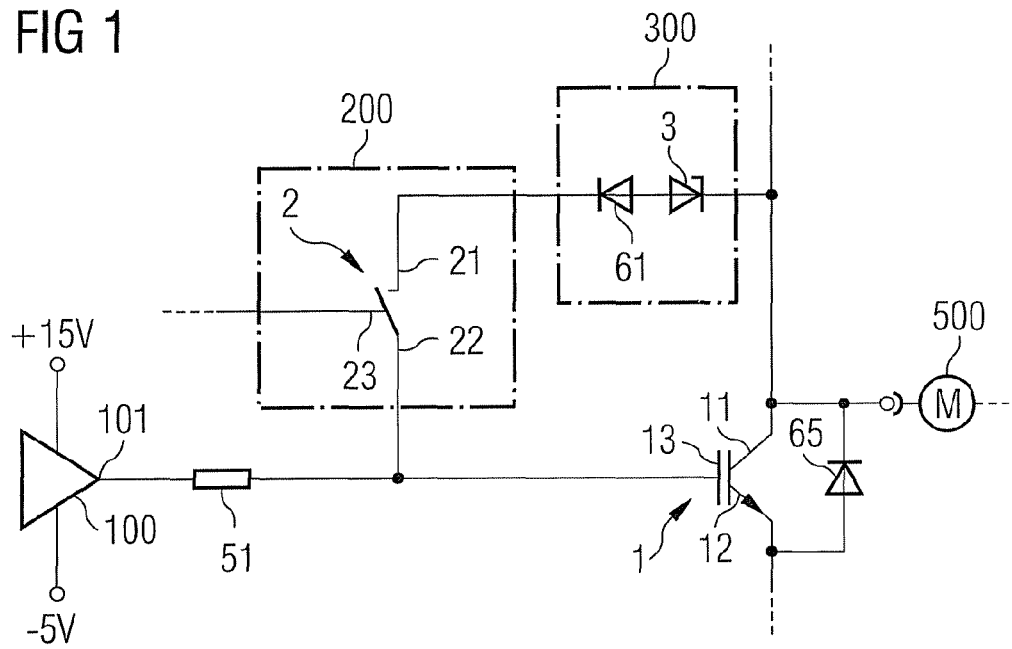
FIG. 1 is a circuit diagram illustrating a power semiconductor arrangement including an AC unit for protecting a controllable power semiconductor switch (for example an IGBT as illustrated), wherein the AC unit can be enabled or disabled by use of a controllable switch. The controllable switch can be controlled for instance by a control signal derived from the driver stage and/or from the rate of voltage rise of a voltage affecting the load path of the controllable power semiconductor switch and/or other suitable means.

FIG. 1 is a circuit diagram illustrating a power semiconductor arrangement including a controllable power semiconductor switch 1, a driver unit 100, a switching unit 200, and an AC unit 300. The controllable power semiconductor switch 1, for instance an IGBT, includes a load path which is formed by the emitter-collector-path of the IGBT. In one or more embodiments, in which the controllable power semiconductor switch 1 may be a MOSFET or a JFET, the load path is a source-drain-path. Inter alia, the controllable power semiconductor switch 1 may be a cascode.

The load path includes a first contact 11 (here: collector contact) and a second contact 12 (here: emitter contact). The driver unit 100 is designed to provide a signal at an output 101 for switching the load path of the controllable power semiconductor switch 1, dependent on the provided signal, in the ON-State or in the OFF-state. In the example of FIG. 1, a positive supply voltage of +15 V and a negative supply voltage of −5 V are provided to supply the driver unit 100. Other voltage levels may be possible as well.

Depending on various requirements of the application, the output 101 of the driver unit 100 may be switched to approximately the positive supply voltage or to approximately the negative supply voltage (the negative supply voltage may be also substituted by a voltage equal to the referenced GND potential of the unit 100). The output 101 is, via an optional first resistor 51, electrically connected to the control input 13 of the controllable power semiconductor switch 1. If the driver unit 100 supplies a voltage, in the present example the above identified, approximately +15 V, of greater than the required threshold voltage of the IGBT 1 to the output 101, the load path of the IGBT 1 will be switched to the conductive ON-State.

By using a control input 13 of the controllable power semiconductor switch 1, the load path may be switched to either an electrically conductive ON-state, or to an electrically blocking OFF-state. In the ON-state, electric power which is provided by a not illustrated power supply, is supplied through the load path of the controllable power semiconductor switch 1 to a load 500, for example a motor M. In the OFF-state, the supply of electric power to the load 500 through the controllable power semiconductor switch 1 is interrupted. For inductive loads, e.g., a motor, a freewheeling diode 65 provides a current path during the OFF-state of the IGBT 1 for the load current. Accordingly, the diode 65 is connected antiparallel to the IGBT 1.

To enable or disable AC technology on demand, a series connection of an AC unit 300 and a controllable switch 2 is connected between the first contact 11 and the control input 13 of the controllable power semiconductor switch 1. The controllable switch 2, which includes a first contact 21 and a second contact 22, may be opened or closed by providing appropriate control signals for opening or closing, respectively, to a control input 23. In order to improve the control signal from the AC unit, an optional signal enhancer (booster) may be arranged between the second contact 22 and the control input 13 of the controllable power semiconductor switch 1.

Such a booster may be identical with the optional booster 400 between the driver unit 100 and the controllable power semiconductor 1. In this case, the second contact 22 of the controllable switch 2 may be connected to the control inputs (here: to the bases of the transistors 41, 42) of the booster 400, but not directly to the control input 13 of the controllable power semiconductor switch 1.

If the controllable switch 2 is closed, the AC circuitry 300 is enabled. The other way around, if the controllable switch 2 is open, AC is disabled. As controllable switch 2, for example, a bipolar junction transistor, a MOSFET, or a thyristor may serve. Depending on the requirements of the application, the controllable switch 2 may be controlled by the output signal of the driver unit 100 and/or by other signals of the circuitry.

The active clamping unit 300 substantially includes a break over unit 3, which, in the embodiment of FIG. 1, is a Z-diode 3. If the AC unit 300 is enabled, i.e. if the controllable switch 2 is closed, a break over of the Z-diode 3 will appear as soon as the voltage $U_{CE}(1)$ affecting the load path of the controllable power semiconductor switch exceeds a pre-defined voltage $U_{BR}(3)$. Caused by such a break over of the break over unit 3, the control input 13 of the controllable power semiconductor switch 1 will switch the controllable power semiconductor switch 1 in the ON-state so as to reduce a possibly dangerous overvoltage affecting the controllable power semiconductor switch 1.

Such a break over occurs, if the voltage affecting the load path of the controllable power semiconductor switch 1 exceeds a value which is a function of the nominal breakdown voltage of the Z-diode 3, certain device parameters (e.g., temperature drift, dynamic over voltages) and the temperature difference from its nominal rate value (e.g., 25° C.):

$$U_{BR}(3) = U_Z(3) \times (1 + \alpha_T \times \Delta_j) \times (1 + tol) + U_{CD}(3)$$

wherein $U_Z(3)$ is the nominal value of the Z-diode 3, $\alpha_T$ is the temperature coefficient of the Z-diode 3, $\Delta_j$ is the expected temperature rise from the nominal temperature (e.g., 25° C.), tol is the tolerance in percent divided by 100% (i.e. tol=1 means 100%) of the Z-diode, and $U_{CD}(3)$ is the dynamic over voltage dependent on the Z-diode peak current. Further influencing parameters, either from the Z-diode itself or other circuit components, may exist and may be considered in defining the trigger level of the AC circuitry. The function of diode 61 is to block any current path from contact 13 to contact 11. Hence, only provide a path from contact 11 to contact 13 once $U_{BR}(3)$ is reached.

Figure 3:
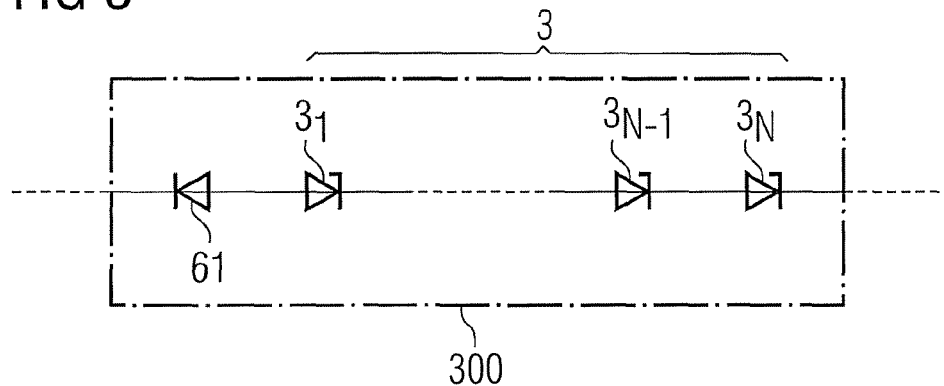
FIG. 3 is a circuit diagram illustrating an AC unit including at least one Z-diode ("Zener diode") which is connected in series with a diode.

To achieve a required $U_{BR}(3)$, which, in one embodiment, depends on the maximum blocking voltage of the controllable power semiconductor switch 1, the break over voltage of the break over unit 3 needs to be adjusted accordingly. In order to increase $U_{BR}(3)$, instead of only one Z-diode, for example, a number N of at least two Z-diodes $3_1 \ldots 3_N$ may be connected in series to form a break over unit 3 as illustrated in FIG. 3. To decrease $U_{BR}(3)$ a Z-diode with lower $U_Z$ may be used.

In the example of FIG. 1, if the driver unit 100 provides an "ON" signal so as to switch the controllable power semiconductor switch 1 to the ON-state, the controllable switch 2 is closed by a not illustrated control unit for switch 2 through contact 23 and AC is enabled. The other way around, if the driver unit 100 provides an "OFF" signal so as to switch the controllable power semiconductor switch 1 to the OFF-state, the controllable switch 2 is open and AC is disabled. This measure ensures that the AC unit 300 is operational during every switching event of the controllable power semiconductor switch 1. Hence—different from conventional AC technology—even at supply voltages, which may reach values close to the breakdown voltage of the controllable power semiconductor switch 1 during the OFF-state, no damage of the controllable power semiconductor switch 1 will occur (an example when this may happen was given above). AC is present in the system when it is needed during switching events of the controllable power semiconductor switch 1. The particular importance of AC, however, comes only during the transition phase changing switch 1 from ON- to OFF-state. Hence, AC needs basically only be enabled during this particular phase.

In one embodiment, the active clamping unit may be activated if the absolute value of the decrease rate |di/dt| of an electric current through the load path of the controllable power semiconductor switch 1 exceeds a pre-defined value.

Figure 2:
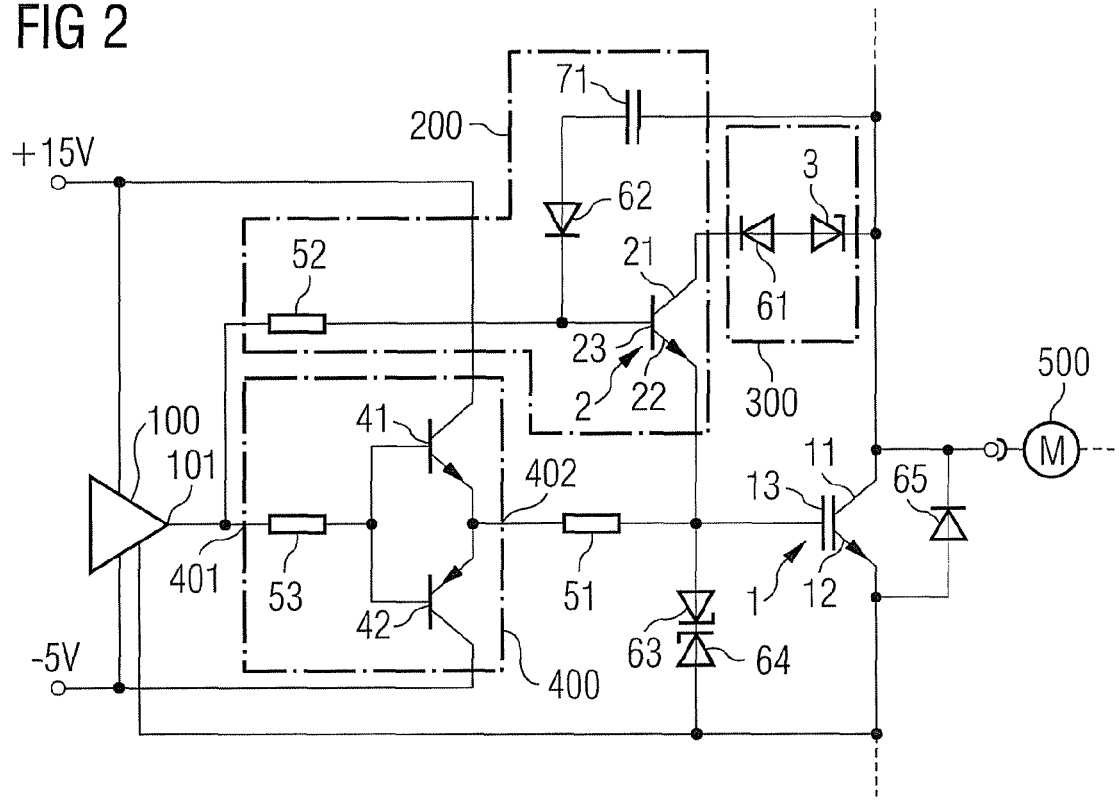
FIG. 2 is a circuit diagram illustrating a power semiconductor arrangement according to FIG. 1 in which the controllable switch is coupled to the output of a driver stage and to a capacitor for detecting the rate of voltage rise of a voltage affecting the load path of the controllable power semiconductor switch.

FIG. 2 illustrates a power semiconductor arrangement which basically includes the same components as the arrangement of FIG. 1, in which the controllable switch 2 is a bipolar npn-junction transistor. Additionally, the control unit for switch 2 is realized by a second resistor 52 between the output 101 of the driver unit 100 and the base 23 of the transistor 2 and/or a series connection of a diode 62 and a capacitor 71 between contact 11 of switch 1 and the base 23 of switch 2.

Then, an optional booster unit 400 including a bipolar npn-junction transistor 41, a bipolar pnp-junction transistor 42, and a third resistor 53 is provided. The booster unit 400 includes an input 401 and an output 402. As described above, the output 101 of the driver unit 100 provides as an example output signals of approximately +15 V or −5 V. The booster unit 400 is connected to the +15 V/−5 V power supply of the driver unit 100 and provides at its output 402 the (boosted) input signal of +15 V or −5 V minus the internal basis-emitter voltage drop of transistor 41 and 42, respectively. The optional booster unit 400 may also be realized by other means, for instance with MOSFETs.

If the output 101 of the driver unit 100 switches to +15 V, the booster unit 400 will turn on the controllable power semiconductor switch 1. In addition, the control input 23 of the controllable switch 2 will be positive biased via the second resistor 52, but perhaps not turned on, because the voltage difference between the emitter 22 and the base 23 may be lower than the required threshold voltage of switch 2. Accordingly, if the output 101 of the driver unit 100 switches to −5 V, the booster unit 400 will turn-off the controllable power semiconductor switch 1 and the controllable switch 2 is or stays also turned off.

Figure 5:
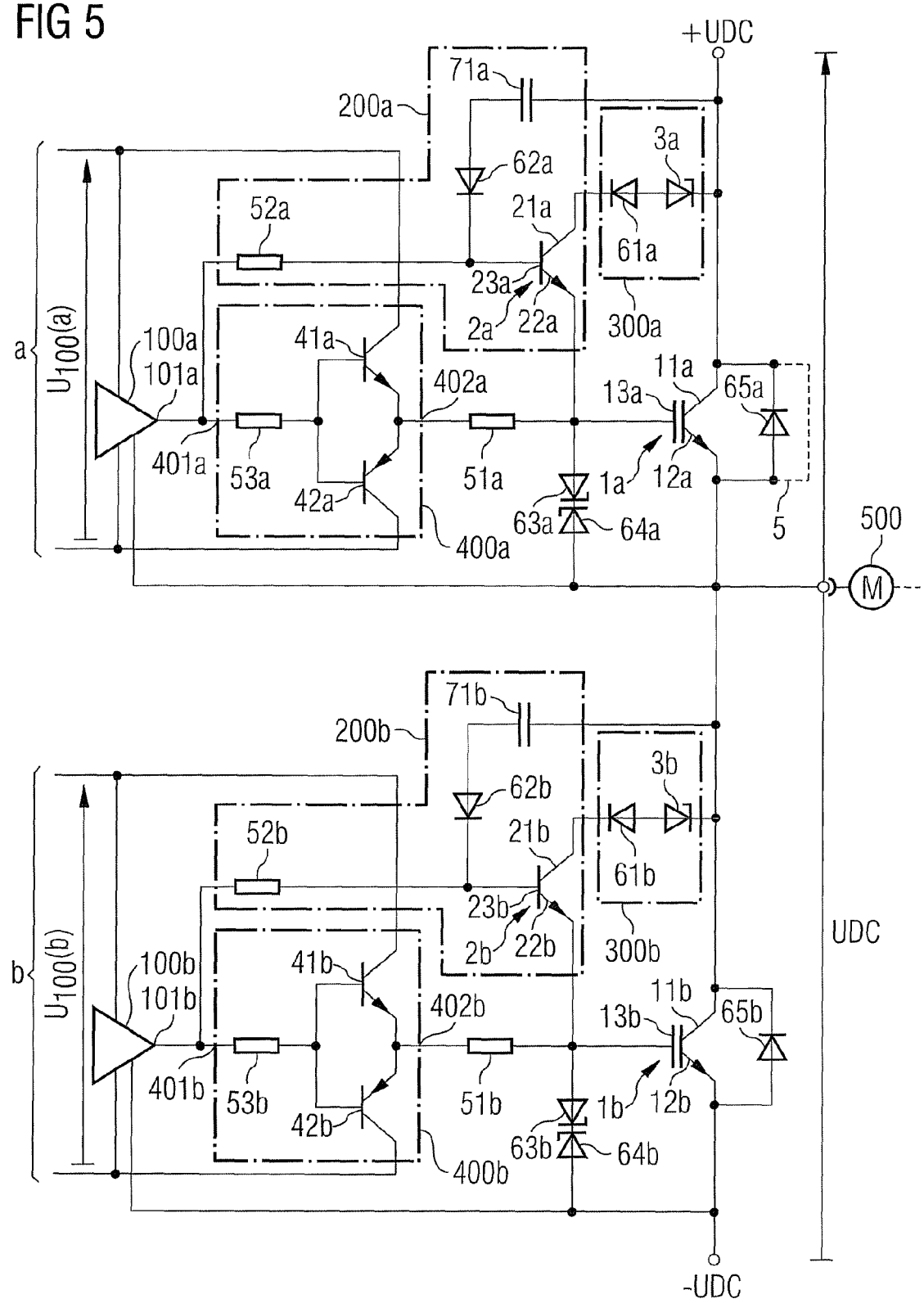
FIG. 5 is a circuit diagram illustrating a half-bridge with an upper branch and a lower branch, each of the branches including an AC unit.

A potential danger of damaging the controllable power semiconductor switch 1 due to overvoltage exists in one embodiment when turning it off, i.e. initiating a current commutation to another power semiconductor (e.g., corresponding freewheeling diode of the other branch of the half-bridge as illustrated in FIG. 5). Due to the current commutation a change of the current i in switch 1 occurs, which is represented by the term di/dt. Together with the always existing parasitic stray inductance $L_\sigma$ in the commutation loop a voltage $U_{IND}$ is generated according to:

$$U_{IND} = -L_\sigma \cdot \frac{di}{dt}$$

wherein $L_\sigma$ is the stray inductance of the commutation loop and t the time. As the turn-off time is very short, $U_{IND}$ may increase to high values which can be hazardous for the controllable power semiconductor switch 1. In one embodiment during turn-off of a short-circuit a large overvoltage may occur.

Therefore, in the arrangement of FIG. 2 it is made sure that the AC unit 300 is enabled at least when turning off the controllable power semiconductor switch 1, i.e. the voltage difference between the base 23 and the emitter 22 of the transistor 2 needs to exceed the required threshold voltage, which depends on the selected type of the transistor 2. This is achieved in this example by use of a capacitor 71 which—in series with an optional protection diode 62—is connected between the first contact 11 and the control input 23 of the controllable switch 2. Diode 62 prevents and/or attenuates a possible current path from contact 23 to contact 11, but provides a path in the opposite direction from contact 11 to contact 23.

During the transition of switch 1 from its ON-state to its OFF-state a change of the voltage $V_{CE}$ between contact 11 and 12 occurs, represented by the term dv/dt. If the value of such a voltage change, i.e. the value of dv/dt, is large enough, the base 23 of the transistor 2 will be biased positive against the emitter 22, i.e. the controllable switch 2 will be turned on and—coming along therewith—the AC unit 300 will be enabled (if not already). The level from which such a voltage change dv/dt will be able to turn on the controllable switch 2 and to enable the AC unit 300 may be set by, inter alia, selecting an appropriate capacity of the capacitor 71 and value of the resistor 52.

The arrangement of FIG. 2 may be, for example, the lower branch of a half-bridge circuit which includes a further controllable power semiconductor switch (not illustrated) with a load path which is connected in series with the load path of the controllable power semiconductor switch 1.

An example for such an arrangement including a half-bridge is illustrated in FIG. 5. The half-bridge includes an upper branch a and a lower branch b. Substantially, each of the branches a, b is identical to the arrangement of FIG. 2. In one embodiment, in FIG. 5 for corresponding components the same reference numerals have been used in FIGS. 2 and 5, however, corresponding to the respective branch, the reference numerals designating components of the branches a or b have been supplemented by an "a" or a "b", respectively.

The half bridge, which is supplied with an electric voltage $+U_{DC}/-U_{DC}$ (DC-bus voltage, whereas $-U_{DC}$ is typical the reference point; hence, can be set to 0 V and $+U_{DC}=U_{DC}$), e.g., from a power converter including a DC-link capacitor (not illustrated) includes two controllable power semiconductor switches 1a, 1b. The load paths of the controllable power semiconductor switches 1a, 1b are connected in series to drive a load 500, e.g., a motor M. During normal operation, none or only one of the controllable power semiconductor switches 1a, 1b is in the ON-state. Otherwise, a short-circuit of the half-bridge might damage the controllable power semiconductor switches 1a, 1b. However, under certain circumstances, such or other short-circuits (caused for instance by a faulty load) may occur. Therefore, a short-circuit detection (not illustrated) may be implemented to detect short-circuits soon enough, i.e. prior to a damage of the controllable power semiconductor switches 1a, 1b, and to switch the controllable power semiconductor switches 1a, 1b off in time ("short-circuit turn-off" with a time defined by the SC-SOA parameters of the controllable power semiconductor). As a result the high negative change of current di/dt during turn-off together with the stray inductance $L_o$ of the commutation loop will—as described above—generate a voltage across typically one of the two controllable power semiconductor switches 1a, 1b.

Figure 4A:
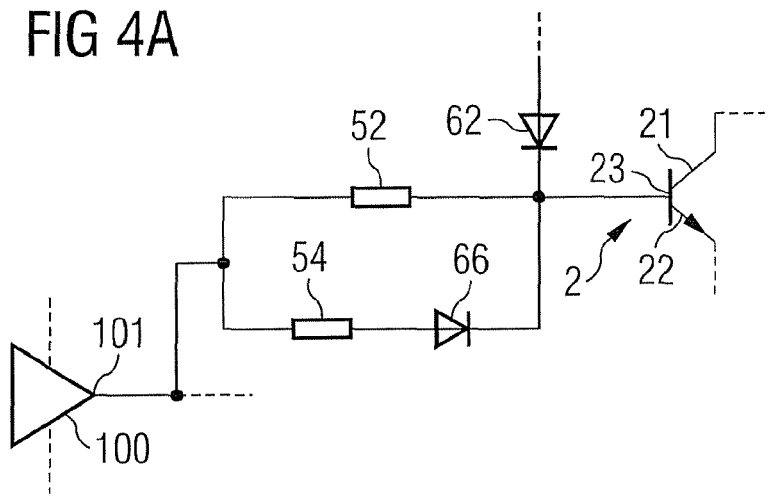
FIG. 4A is a modification illustrating the circuit diagram of FIG. 2 in which a resistor network with a diode to have separate paths for turning on and turning off of the controllable switch.
Figure 4B:
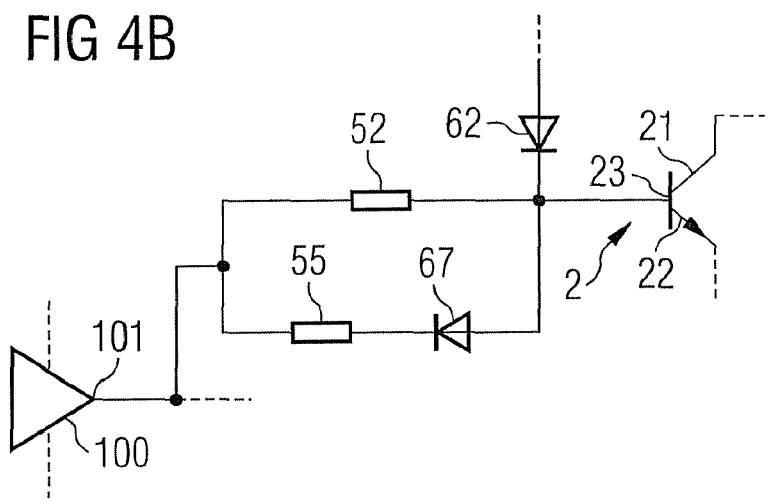
FIG. 4B is another modification illustrating the circuit diagram of FIG. 2, in which a resistor network with a diode to have separate paths for turning on and turning off of the controllable switch.

FIGS. 4A and 4B illustrate—in a detail view of FIG. 2—modifications of the arrangements of FIG. 2. In these modifications, in addition to the resistor 52, series connections with a resistor 54 (55) and a diode 66 (67) are connected between the output 101 of the driver unit 100 and the control input 23 of the switching unit 2. The resistor 52 and these series connections form separate paths for turning on and turning off the switching unit 2.

In FIG. 5, the capacitors 71a, 71b are chosen to have a capacity which causes enabling the AC units 300a or 300b during a short-circuit turn-off event of the half-bridge, but not during a "normal" turn-off event of the controllable power semiconductor switches 1a or 1b. The electric voltages U100(a) and U100(b) for supplying the driver units 100a and 100b, respectively, may be low compared with the supply voltage $U_{DC}$ of the half-bridge, even at values of $U_{DC}$. Except for the controllable power semiconductor switches 1a, 1b and the freewheeling diodes 65a, 65b, low voltage components, and in one embodiment low voltage drivers 101a, 101b, booster 41a/42a, 41b/42b can be used. Transistor 2a, 2b has to be chosen that the combined break-down voltage of transistor 2a (2b) and Z-diode 3a (3b) is larger than the expected nominal supply voltage $U_{DC}$ including a temporarily increase as described above in case of self propelled applications like EV and HEV. Typically this combined break-down voltage is selected to be slightly larger than the break-down voltage of switch 1a (1b) as the switch 1a (1b) is already selected considering the highest possible voltage $U_{DC}$ occurring in the application.

Figure 6:
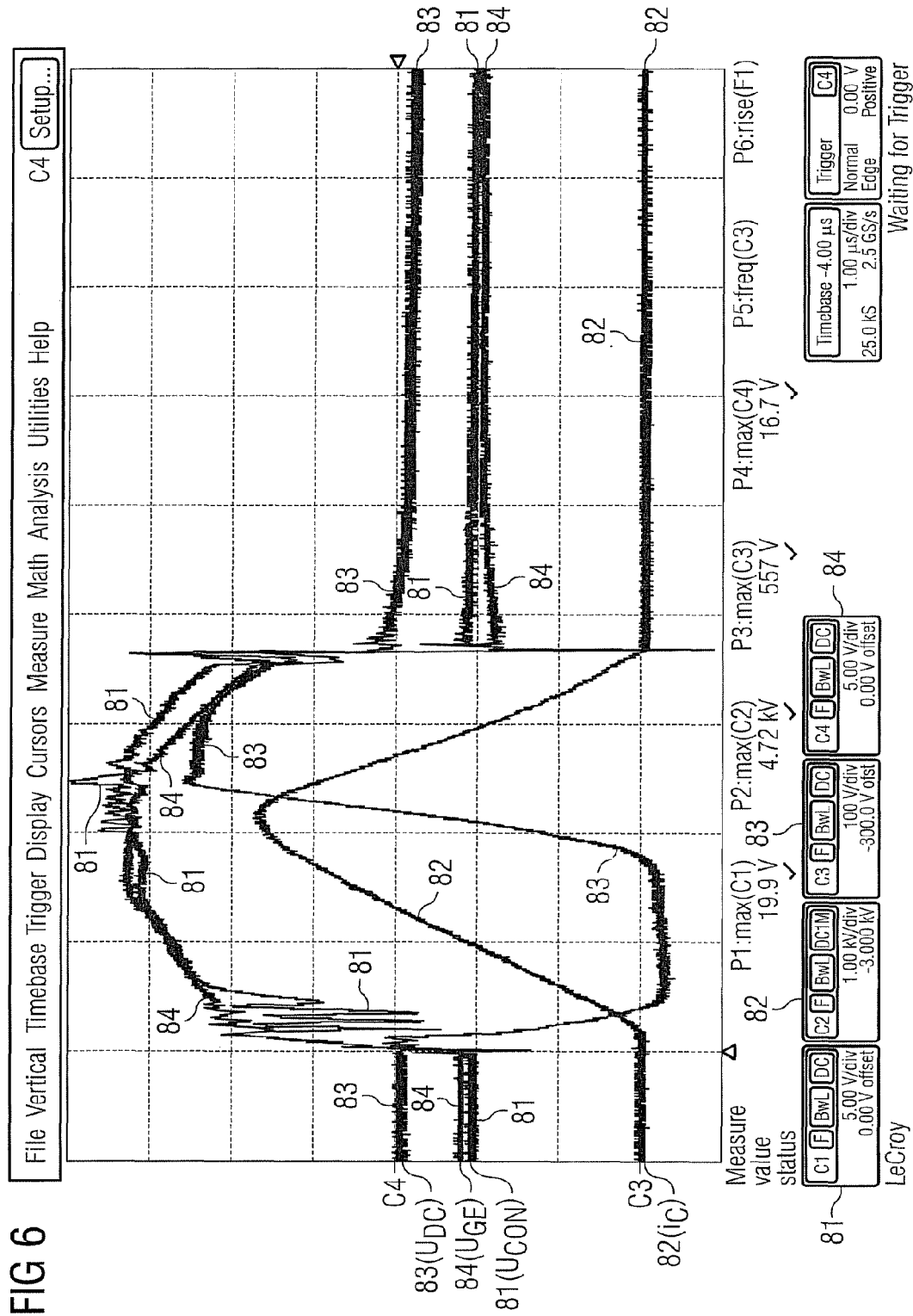
FIG. 6 is a diagram illustrating measurement results from a test circuitry of a half-bridge including conditional active clamping (CAC) as illustrated in FIG. 5, in which the supply voltage of the half-bridge is below the trigger voltage for AC (here $U_Z(3)=500$ V). The top switch of the half-bridge was shorted to simulate a short-circuit event, which needed to be detect, processed, and safely turned off. During transition from the ON- to the OFF-state a voltage larger than the supply voltage occurs, which exceeds the trigger voltage of the AC circuitry. Accordingly, the AC limits the maximum voltage to a defined value, which is lower than the break-down voltage of the controllable power semiconductor (here $U_{(BR)CES}(1)=600$ V). The illustrated voltage $U_{con}(81)$ in the diagram represents the control voltage of switch $2b$ at contact $23b$. $I_C(82)$, $U_{GE}(84)$ and $U_{DC}(83)$ (respectively $U_{CE}$) are the collector current, the gate voltage and the collector-emitter voltage of switch $1b$.

FIG. 6 illustrates a measurement result from a test circuitry of a half bridge as illustrated in FIG. 5 with a hot-wired load path of the controllable power semiconductor switch 1a of the upper half bridge a. The hot-wiring is indicated by a dashed line 5 to describe a short-circuit event.

To verify that CAC together with the transistor 2b works as predicted, short-circuit tests were performed by switching the load path of the controllable power semiconductor switch 1b of the lower branch b of the half-bridge to the conductive "ON"-state via an appropriate output signal of the driver unit 100b. The nominal AC voltage $U_Z(3)$ at which AC in the lower branch b should be enabled was set to 500 V.

In FIG. 6, the nominal DC-bus voltage $U_{DC}$ is set to 300 V. It was verified that active clamping together with the transistor 2b sufficiently protects the controllable power semiconductor switch during the short-circuit turn-off limiting the maximum voltage across contacts 11 and 12 to a value below $U_{(BR)CES}(1)$=600 V for selected switch 1b.

Figure 7:
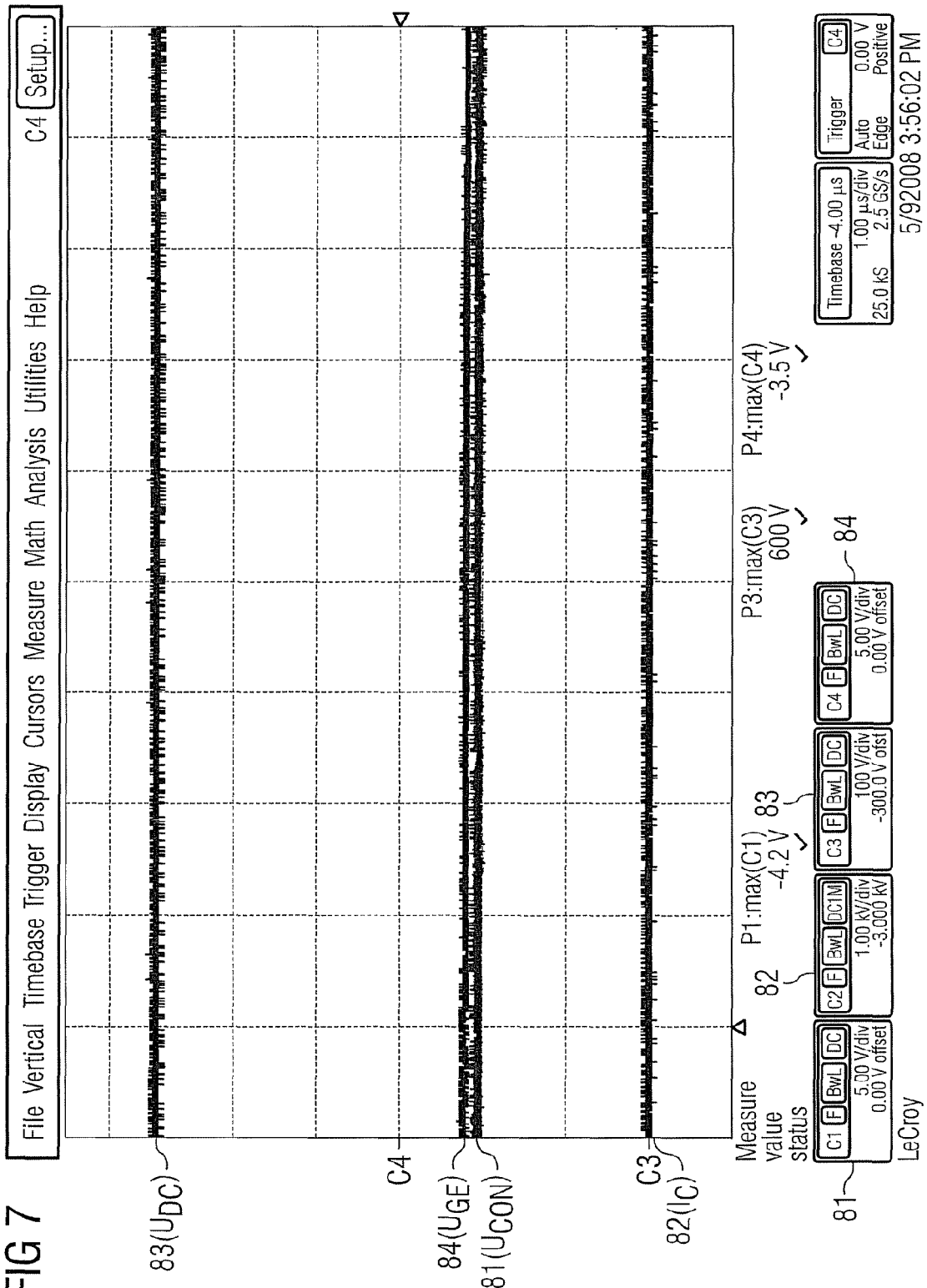
FIG. 7 illustrates a diagram according to FIG. 6, however at a supply voltage $U_{DC}$ (here $U_{DC}$=600 V) of the half-bridge which exceeds the trigger voltage for AC (here $U_Z(3)$=500 V) during non-switching operation, but of course is not exceeding $U_{(BR)CES}(1)$ of the controllable power semiconductor (here $U_{(BR)CES}(1)$=600 V).

FIG. 7 illustrates how the circuitry behaves during non-switching events and a supply voltage $U_{DC}$ exceeding the nominal break-down voltage of the AC circuitry, which is determined by Z-diode 3b. Due to the additional blocking capability of switch 2b, no accidental turn-on of switch 1b occurs, which would lead to the destruction this device.

Depending on the requirements of the respective application, the described CAC technology may be used as sole overvoltage protection, or in combination with other technologies, e.g., as final safety protection. The idea is to have AC in place when it is needed and to disable it, when it is not required or even would harm the controllable power semiconductor, due to the nature of the particular selected application like self propelled applications (e.g., HEV). During normal operation, AC works as it is known from standard solutions used, for example, in general purpose drives, or in any other branches of industry.

If the inverter is in a state where all controllable power semiconductor switches 1 of a single switch (FIGS. 2 and 5) or 1a and 1b of a half-bridge (FIG. 5) are turned off, active clamping may be disabled by keeping switch 2, 2a, 2b in OFF-state. This is achieved by proper selection of the switch itself (e.g., its threshold voltage) as well as of the capacitor 71, 71a, 72b and the resistor 52, 52a, 52b. Doing so prevents—in cases in which the voltage across the load path of a controllable power semiconductor switch 1, 1a, 1b exceeds the break over voltage $U_{BR}(3)$, $U_{BR}(3a)$ or $U_{BR}(3b)$ of the respective Z-diode 3, 3a or 3b (the forward voltages $U_F(61)$ of the protection diodes 61, 61a, 61b disregarded) of the respective power semiconductor switch 1, 1a or 1b—from an accidental turn-on, which is to be avoided in generally in all applications. However, in other applications different from self propelled applications like EV and HEV, active clamping may be enabled also if all controllable power semiconductor switches 1a and 1b of a half-bridge are turned off.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor arrangement comprising:
   a controllable power semiconductor switch comprising a load path with a first contact and with a second contact, and a control input for controlling the load path;
   a driver unit for controlling the controllable power semiconductor switch, wherein the driver unit comprises an output electrically coupled to the control input of the controllable power semiconductor switch;
   a controllable switch comprising a control input, electrically coupled to the output of the driver unit or another signaling circuitry, wherein the controllable switch is configured to be switched off if the output of the driver unit or another signaling circuitry provides a signal to remain the load path of the controllable power semiconductor switch in an electrically blocking OFF-state, and wherein the controllable switch is configured to be switched on if the output of the driver unit or another signaling circuitry provides a signal for switching the load path of the controllable power semiconductor switch from an electrically conductive ON-state to an electrically blocking OFF-state; and
   an active clamping (AC) unit coupled in series with the controllable switch between the control input of the controllable power semiconductor switch and either the first or the second contact of the load path of the controllable power semiconductor switch.

2. The power semiconductor arrangement of claim 1, wherein the AC unit comprises a voltage break-over unit.

3. The power semiconductor arrangement of claim 2, wherein the voltage break-over unit comprises a Z-diode, or a series connection wherein at least two Z-diodes are coupled in series with a blocking diode.

4. The power semiconductor arrangement of claim 1, comprising a capacitor for switching on the controllable switch if the rate of voltage rise of an electric voltage affecting the load path of the controllable power semiconductor switch exceeds a pre-defined value.

5. The power semiconductor arrangement of claim 4, wherein the capacitor or a series connection with the capacitor and a diode and/or a resistor in series is electrically coupled between the control input of the controllable switch and either the first or the second contact of the load path of the controllable power semiconductor switch.

* * * * *